United States Patent
Lee et al.

(10) Patent No.: US 7,928,806 B2
(45) Date of Patent: Apr. 19, 2011

(54) LOW VOLTAGE FREQUENCY SYNTHESIZER USING BOOSTING METHOD FOR POWER SUPPLY VOLTAGE OF CHARGE PUMP

(75) Inventors: Hui Dong Lee, Daejeon (KR); Kwi Dong Kim, Daejeon (KR); Jong Kee Kwon, Daejeon (KR); Jong Pil Hong, Daejeon (KR); Sang Gug Lee, Daejeon (KR)

(73) Assignees: Electronics and Telecommunications Research Institute, Daejeon (KR); Korea Advanced Institute of Science and Technology, Daejeon (KR)

( * ) Notice: Subject to any disclaimer, the term of this patent is extended or adjusted under 35 U.S.C. 154(b) by 35 days.

(21) Appl. No.: 12/561,910

(22) Filed: Sep. 17, 2009

(65) Prior Publication Data
US 2010/0156542 A1  Jun. 24, 2010

(30) Foreign Application Priority Data

Dec. 18, 2008  (KR) ......... 10-2008-0129615
Aug. 3, 2009  (KR) ......... 10-2009-0071284

(51) Int. Cl.
*H03B 5/12* (2006.01)
*H03L 5/00* (2006.01)
*H03L 7/06* (2006.01)
*H03L 7/08* (2006.01)
*H03L 7/085* (2006.01)
*H03L 7/089* (2006.01)
*H03L 7/099* (2006.01)
*H03L 7/18* (2006.01)

(52) U.S. Cl. ............ 331/17; 331/8; 331/16; 331/117 FE; 331/179; 331/183; 327/157

(58) Field of Classification Search .......... 331/8, 16–18, 331/25, 36 C, 117 R, 117 FE, 117 D, 168, 331/177 R, 177 V, 179, 182, 183; 327/156–159; 332/127; 360/51; 375/376; 455/260

See application file for complete search history.

(56) References Cited

U.S. PATENT DOCUMENTS 5,144,156 A * 9/1992 Kawasaki ............. 327/157
(Continued)

FOREIGN PATENT DOCUMENTS

JP  09-191248  7/1997
(Continued)

OTHER PUBLICATIONS

Kwangho Yoon et al., "Charge pump boosting technique for power noise immune high-speed PLL implementation," IEEE Electronic Letters, pp. 1445-1446, vol. 34, No. 15, IEEE, 1998.
(Continued)

*Primary Examiner* — David Mis

(57) ABSTRACT

Provided is a low voltage frequency synthesizer using a boosting method for a power supply voltage of a charge pump. The low voltage frequency synthesizer includes a phase/frequency detector (PFD) that receives and compares a reference frequency and a feedback frequency to output a comparison signal, a charge pump that receives the comparison signal to output a current corresponding to the comparison signal, a low-pass filter (LPF) that generates a voltage corresponding to the output current of the charge pump, a voltage controlled oscillator (VCO) that receives the voltage of the LPF, amplifies the voltage to generate a boosting voltage, and outputs a frequency corresponding to the received voltage, and a DC converter that receives the boosting voltage of the VCO, converts the boosting voltage into a DC voltage, and applies the DC voltage as a power supply voltage of the charge pump. Since the supply voltage of the charge pump is provided from the LC-circuit-based VCO, the frequency synthesizer has superior characteristics such as a wide locking range, low phase noise, and the prevention of performance degradation caused by an external environment or process variations.

12 Claims, 4 Drawing Sheets

U.S. PATENT DOCUMENTS

| | | | |
|---|---|---|---|
| 5,623,523 | A | 4/1997 | Gehrke |
| 5,838,180 | A | 11/1998 | Partyka |
| 6,249,685 | B1 | 6/2001 | Sharaf et al. |
| 2009/0273379 | A1* | 11/2009 | Fu .................................. 327/157 |

FOREIGN PATENT DOCUMENTS

| | | |
|---|---|---|
| JP | 2004-274673 | 9/2004 |
| KR | 1020060032240 A | 4/2006 |
| KR | 1020080026612 A | 3/2008 |

OTHER PUBLICATIONS

Chih-Ming Hung et al., "A Fully Integrated 1.5-V 5.5-GHz CMOS Phase-Locked Loop," IEEE Journal of Solid-State Circuits, pp. 521-525, vol. 37, No. 4, IEEE, 2002.

Dongmin Park et al., "An Adaptive Body-Biased VCO with Voltage-Boosted Switched Tuning in 0.5-V Supply," Korea Advanced Institute of Science and Technology Electronic Letters, pp. 444-447, IEEE, 2006.

Hyung-Seuk Kim et al., "A 1-V Fully Intergrated CMOS Frequency Synthesizer for 5-GHz WLAN," Korea Advanced Institute of Science and Technology Electronic Letters, pp. 4389-4392, IEEE, 2005.

Gaung-Kaai Dehng et al., "A 900-MHz 1-V CMOS Frequency Synthesizer," IEEE Journal of Solid-State Circuits, pp. 1211-1214, vol. 35, No. 8, IEEE, 2000.

* cited by examiner

LOW VOLTAGE FREQUENCY SYNTHESIZER USING BOOSTING METHOD FOR POWER SUPPLY VOLTAGE OF CHARGE PUMP

CROSS-REFERENCE TO RELATED APPLICATION

This application claims priority to and the benefit of Korean Patent Application Nos. 10-2008-0129615, filed Dec. 18, 2008 and 10-2009-0071284, filed Aug. 3, 2009, the disclosure of which is incorporated herein by reference in its entirety.

BACKGROUND

1. Field of the Invention

The present invention relates to a frequency synthesizer, and more specifically, to a low voltage frequency synthesizer using a boosting method for a power supply voltage of a charge pump, in which a dynamic range of the charge pump is extended to improve performance.

2. Discussion of Related Art

Recently, as convergence of technology necessitates integration, complementary metal-oxide semiconductor (CMOS) process techniques are rapidly developing. However, in analog circuit design, providing low voltage and low output impedance with the development of the CMOS process techniques is being raised as a problem to be overcome. In the structure of a frequency synthesizer requiring a low voltage and high performance, design for a charge pump serving as an analog circuit is considered an issue to be overcome. When designing the charge pump with a low voltage, the dynamic range of an output control voltage decreases. This may cause a reduction in frequency tuning range of a voltage-controlled oscillator (VCO), degradation of phase noise, and a reduction in design margin for performance drift compensation for an external environment and process variations.

In a conventional structure, a voltage higher than a supply voltage is generated through an additional circuit such as a Dixon charge pump, an AC amplifier, or a voltage doubler, and then used as a control voltage of a VCO or applied as a supply voltage of a charge pump.

Specifically, the Dixon charge pump is used as a charge transfer pump to convert an output voltage of the charge pump into a wide control voltage, and then apply the converted control voltage to the VCO, thereby improving locking range and phase noise characteristics. Alternatively, a boosting voltage generated through the voltage doubler or AC amplifier is applied as a supply voltage of the charge pump to improve locking range and phase noise characteristics.

However, the conventional structure wastes power, and a chip area increases because of the additional circuit.

SUMMARY OF THE INVENTION

The present invention is directed to a low voltage frequency synthesizer which has wide locking range and low phase noise characteristics and can prevent the performance degradation caused by an external environment and process variations by extending the dynamic range of a charge pump.

One aspect of the present invention provides a low voltage frequency synthesizer using a boosting method for a power supply voltage of a charge pump, including: a phase/frequency detector (PFD) that receives and compares a reference frequency and a feedback frequency to output a comparison signal; a charge pump that receives the comparison signal to output a current corresponding to the comparison signal; a low-pass filter (LPF) that generates a voltage corresponding to the output current of the charge pump; a voltage controlled oscillator (VCO) that receives the voltage of the LPF, amplifies the voltage to generate a boosting voltage, and outputs a frequency corresponding to the received voltage; and a DC converter that receives the boosting voltage of the VCO, converts the boosting voltage into a DC voltage, and applies the DC voltage as a power supply voltage of the charge pump.

The VCO may include an LC circuit which amplifies the received voltage to generate the boosting voltage.

The boosting voltage may be two AC voltages which have opposite phases and of which the maximum magnitude reaches a value twice that of the input voltage.

The VCO may further include an auto amplitude controller (AAC) for constantly maintaining the amplitude of the AC voltages.

The charge pump may receive the boosting voltage as a power supply voltage to operate in an extended output control voltage range.

A frequency tuning range for frequency tuning of the VCO may increase in accordance with the extended output control voltage range of the charge pump.

A frequency gain of the VCO may decrease in accordance with the extended output control voltage range of the charge pump.

The low voltage frequency synthesizer may further include a frequency divider that divides the output frequency of the VCO to generate the feedback frequency.

The VCO may include a switched cap bank array (SCB) as the LC circuit.

The VCO may include a pair of differential switching transistors which respectively receive the AC voltages as the boosting voltage and a current source transistor which receives a control voltage for amplitude control from the AAC.

One terminal of the current source transistor may be commonly connected to one terminal of each of the differential switching transistors, the other terminal thereof may be grounded, and a gate thereof may receive the control voltage of the ACC.

The maximum value of the extended output control voltage range of the charge pump may correspond to a magnitude obtained by excluding voltages consumed by the DC converter and the charge pump from the maximum voltage of the boosting voltage.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1:
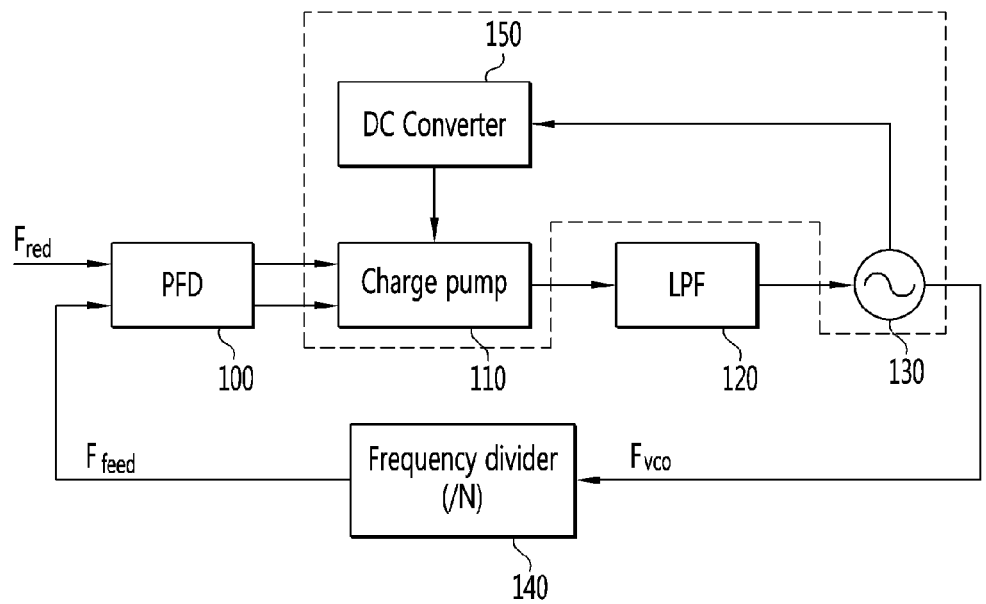
FIG. 1 is a diagram showing the configuration of a frequency synthesizer according to the present invention.

Hereinafter, exemplary embodiments of the present invention will be described in detail with reference to the accompanying drawings such that it can be easily made by those skilled in the art. However, the present invention can be implemented in various different forms, and is not limited to the exemplary embodiments. To clearly describe the present invention, some portions having no relation with the descriptions of the present invention will be omitted from the drawings. Throughout the specification, like reference numerals will be attached to the same components.

Throughout the specification, when it is described that a certain portion is "connected" to another portion, this includes not only a case in which the portion is "directly connected," but also a case in which the portion is "electrically connected" with another element interposed therebetween.

Throughout the specification, when it is described that a certain portion includes a certain component, this means that another component is not excluded, but the portion may further include another component, as long as an opposite description is not specifically made. Further, terms such as " . . . unit," "-er/-or," " . . . module" and so on used in the specification mean a unit which processes at least one function or operation, and the unit may be implemented by hardware, software, or a combination of hardware and software.

Hereinafter, a frequency synthesizer according to the present invention will be described with reference to FIGS. 1 and 2.

Figure 2:
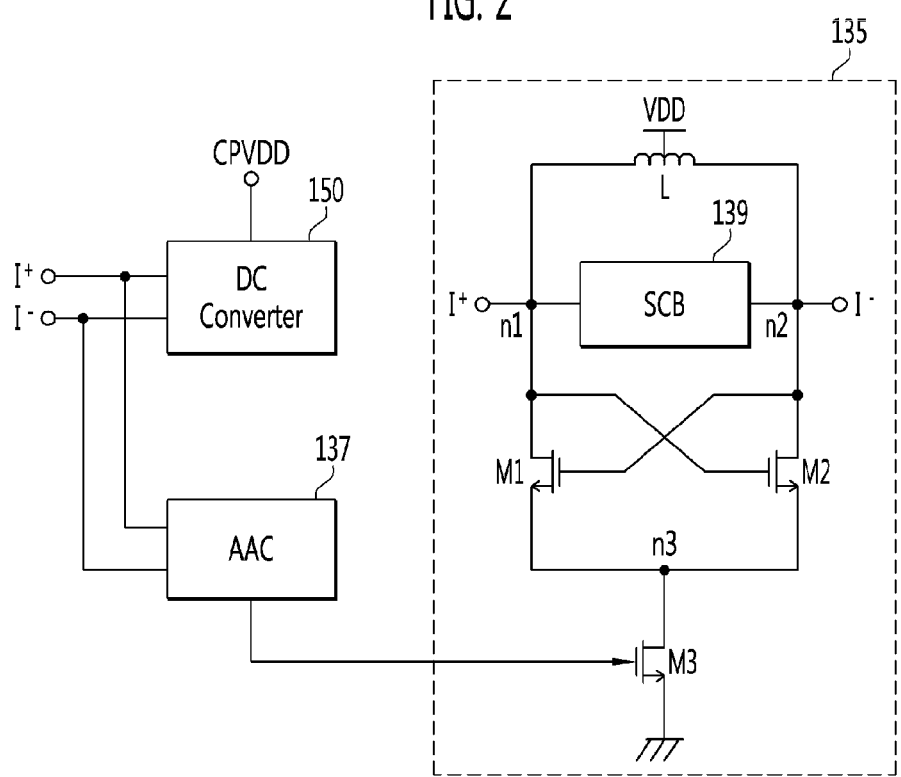
FIG. 2 is a detailed diagram of a voltage controlled oscillator (VCO) of FIG. 1.

FIG. 1 is a diagram showing the configuration of the frequency synthesizer according to the present invention, and FIG. 2 is a detailed diagram of a voltage controlled oscillator (VCO) of FIG. 1.

Referring to FIG. 1, the frequency synthesizer according to the present invention includes a phase/frequency detector (PFD) 100, a charge pump 110, a low-pass filter (LPF) 120, a frequency divider 140, a DC converter 150, and an LC VCO 130 having an auto amplitude controller (AAC).

The PFD 100 compares a reference frequency $F_{\rho \epsilon \phi}$ with a feedback frequency $F_{\phi \epsilon \epsilon \delta}$ which is obtained by dividing a voltage control frequency $F_{\overline{\omega} \chi o}$ of the VCO 130 through the frequency divider 140. Depending on the comparison result, the PFD 100 outputs an up or down signal.

The charge pump 110 receives a power supply voltage from the DC converter 150 and responds to the up or down signal output from the PFD 100 to output a corresponding current to the LPF 120.

The LPF 120 outputs a voltage corresponding to the current output from the charge pump 110 to the VCO 130.

The VCO 130 generates and outputs a voltage control frequency $F_{\omega \chi o}$ corresponding to the output voltage of the LPF 120.

At this time, the VCO 130 including an LC circuit applies a boosting output of the LC circuit to the DC converter 150 to convert it into a power supply voltage of the charge pump 110.

Hereinafter, a supply voltage generating process of the charge pump 110 using the output of the VCO 130 will be described.

Referring to FIG. 2, the power supply voltage of the charge pump is generated by the VCO and the DC converter.

The VCO 130 of FIG. 1 includes an AC voltage generator 135 and an AAC 137.

The AC voltage generator 135 includes an LC circuit, a pair of differential switching transistors M1 and M2, and a current source transistor M3.

In this case, a capacitor may be implemented of a switched cap bank array (SCB) 139.

That is, the LC circuit generates an AC voltage based on a reference voltage VDD, and then outputs a first AC output voltage I+ to a first terminal n1 and a second AC output voltage I− to a second terminal n2. The first differential switching transistor M1 is connected between the first terminal n1 and a third terminal n3 to receive the second AC output voltage I− of the second terminal n2 through a gate thereof. The second differential switching transistor M2 is connected between the second terminal n2 and the third terminal n3 to receive the first AC output voltage I+ of the first terminal n1 through a gate thereof.

The current source transistor M3 is connected between the third terminal n3 and a ground terminal and receives an output voltage of the ACC 137 through a gate thereof.

The DC converter 150 receives the two AC output voltages I+ and I− of the first and second terminals n1 and n2 to convert them into a DC voltage, and then supplies the DC voltage as a power supply voltage CPVDD of the charge pump 110.

At this time, the AAC 137 is used to maintain a constant amplitude in every frequency band when designing a broadband VCO. Further, the AAC 137 receives the two output voltages I+ and I− of the VCO 130 and then outputs the result. By feeding back the result as an input voltage of the gate of the current source transistor M3 of the VCO 130, the AAC 137 constantly maintains the amplitude of the two AC output voltage I+ and I− of the first and second terminals n1 and n2.

Hereinafter, an output of the frequency synthesizer according to the present invention will be described with reference to FIGS. 3 to 6.

Figure 3:
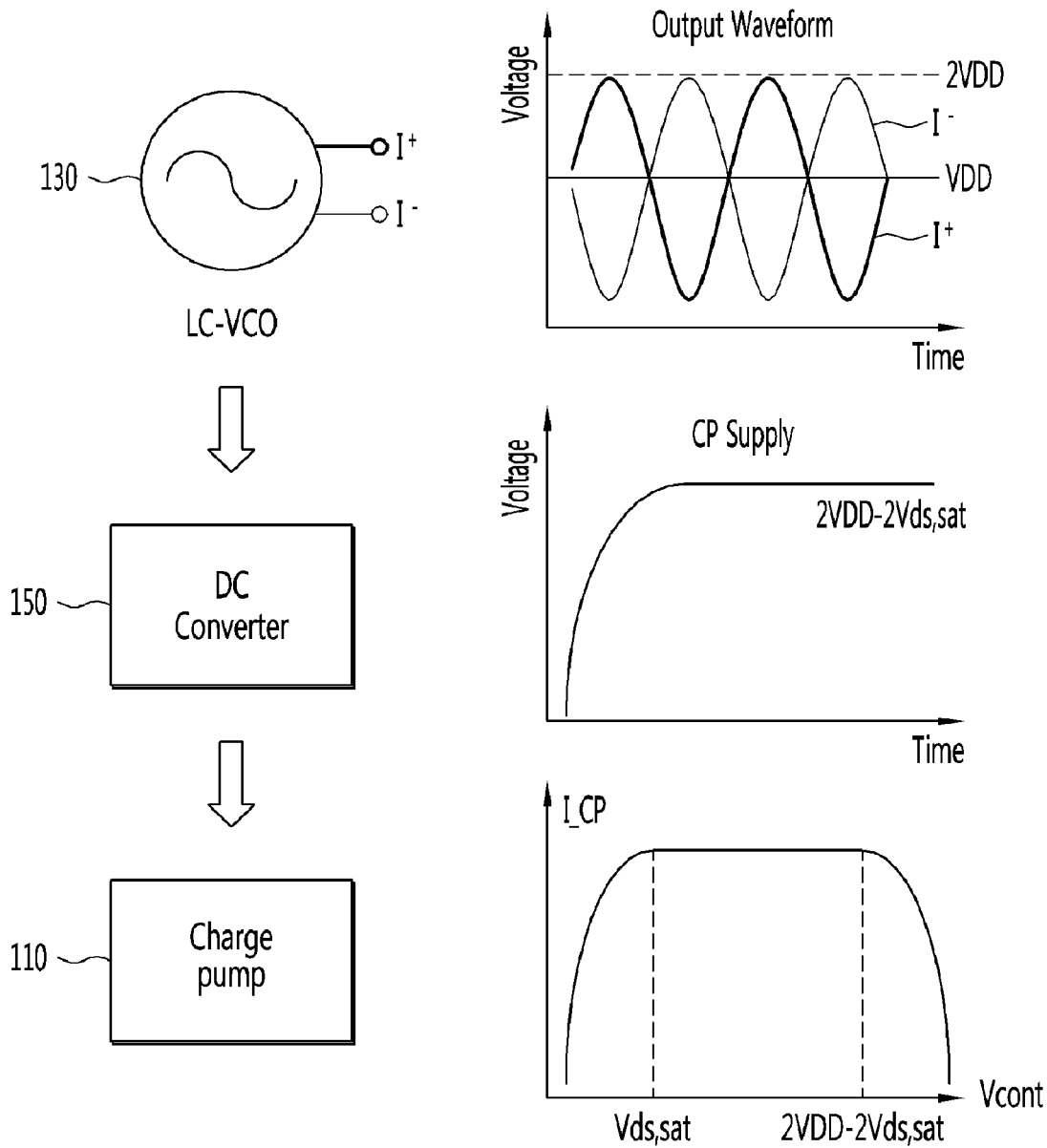
FIG. 3 is a graph showing the dynamic ranges of outputs of a DC converter, the VCO, and a charge pump of FIG. 1.
Figure 4:
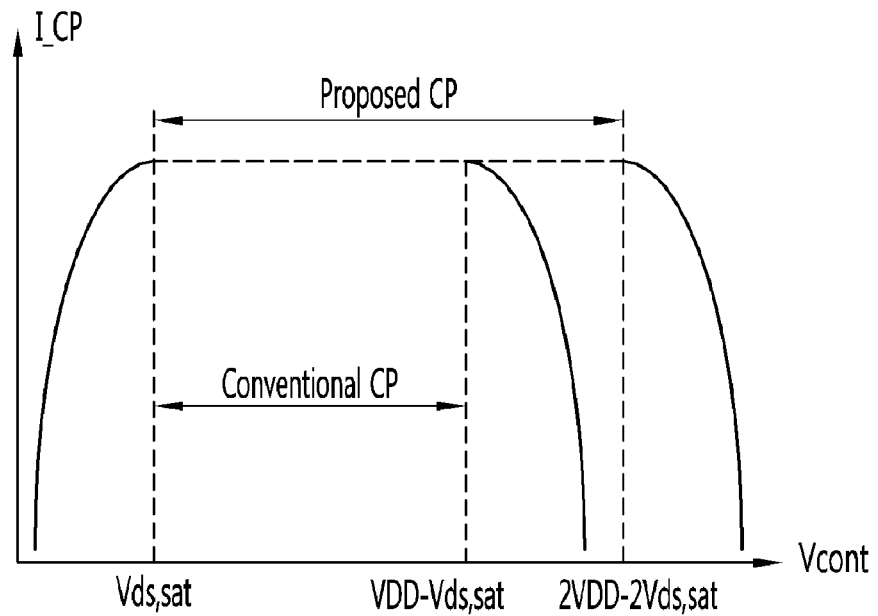
FIG. 4 is a graph showing the dynamic range of a power supply voltage of the charge pump of FIG. 3.
Figure 5:
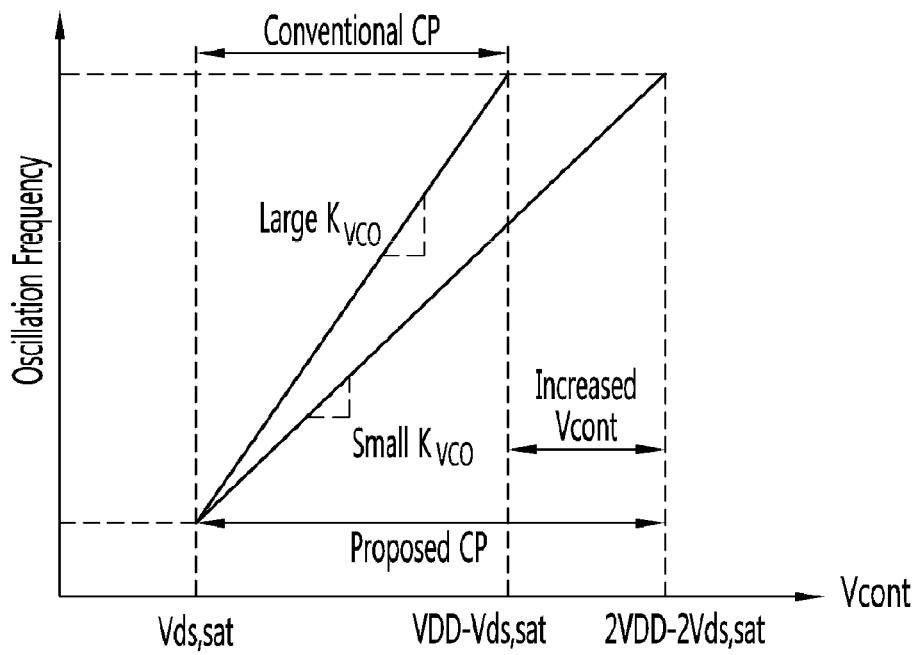
FIG. 5 is a graph showing a frequency gain of the VCO according to the present invention.
Figure 6:
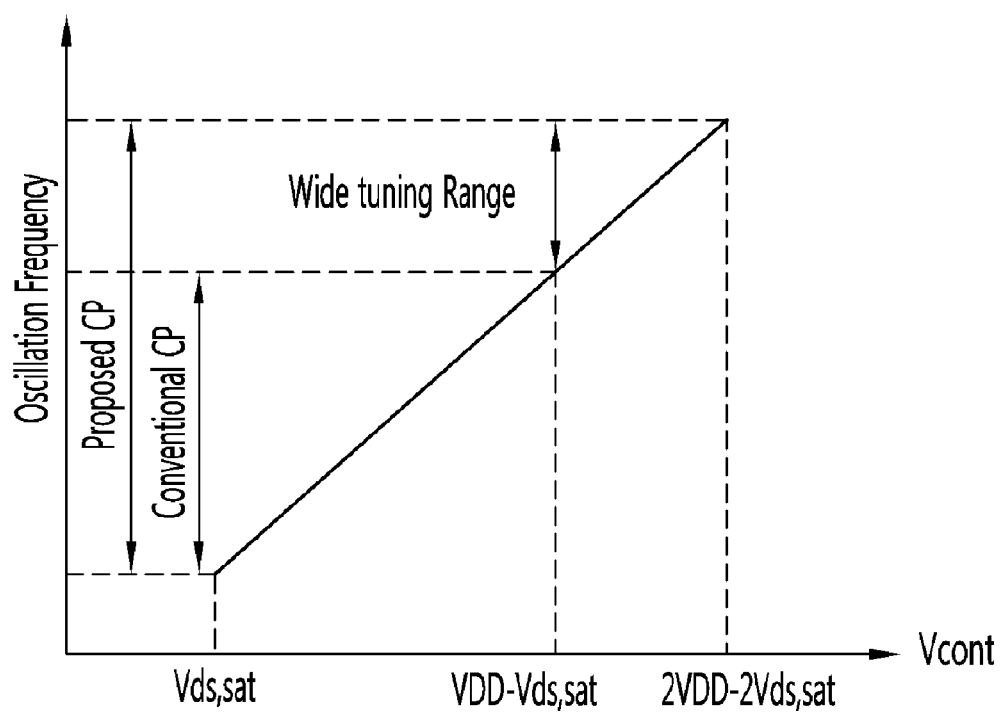
FIG. 6 is a graph showing the frequency tuning range of the VCO according to the present invention.

FIG. 3 is a graph showing the dynamic ranges of outputs of the DC converter, the VCO, and the charge pump of FIG. 1. FIG. 4 is a graph showing the locking range of the charge pump of FIG. 3. FIG. 5 is a graph showing a frequency gain of the VCO according to the present invention. FIG. 6 is a graph showing the frequency tuning range of the VCO according to the present invention.

Referring to FIG. 3, the maximum amplitude of AC output voltages I+ and I− in the LC-circuit-based VCO 130 reaches a value twice that of the reference voltage VDD.

That is, the AC output voltages I+ and I− output from the first and second terminals n1 and n2 of the VCO 130 have opposite phases, and the maximum amplitude thereof corresponds to a magnitude twice that of the reference voltage VDD.

The DC converter 150 having received the AC output voltages I+ and I− converts the AC output voltages I+ and I− of the VCO 130 into a constant DC voltage having the maximum magnitude. At this time, the DC output voltage becomes $2V_{AA}-V_{\delta o, o \alpha \tau}$ by a small amount of voltage reduction $V_{\delta o, o \alpha \tau}$ for operation of the DC converter 150.

The DC voltage generated by the DC converter 150 is applied as a power supply voltage CPVDD of the charge pump 110, and has an output-control-voltage dynamic range from $V_{\delta o, o \alpha \tau}$ to $2V_{AA}-2V_{AA}-2V_{\delta o, o \alpha \tau}$ excluding a small amount of voltage reduction $V_{\delta o, o \alpha \tau}$ for operation of the charge pump 110.

In the above description, it has been described that the amount of voltage reduction of the DC converter 150 is identical to that of the charge pump 110. However, the amounts of voltage reduction may differ from each other.

Referring to FIG. 4, when compared with the output-control-voltage dynamic range of a charge pump included in a conventional frequency synthesizer, the dynamic range of the charge pump according to the present invention is extended as much as $V_{AA}-2V_{\delta o, o \alpha \tau}$. The dynamic range extended in such a manner secures a design margin of the charge pump 110, which makes it possible to prevent performance degradation of the frequency synthesizer caused by an external environment or process variations.

Further, as the dynamic range of the output control voltage of the charge pump 110 is extended as shown in FIG. 5, the frequency tuning range by of the VCO increases.

Therefore, when designing the VCO 130 having the same frequency tuning range, a change slope $K_{\nu xo}$ of an output frequency by a control voltage change in the VCO 130 according to the present invention decreases compared to the conventional structure. Such a reduction in frequency gain $K_{\nu xo}$ reduces a chip area of the LPF and improves phase noise performance of the VCO.

Referring to FIG. 6, when designing a VCO of which the slope of frequency gain is fixed, a frequency tuning range by the extended control voltage according to the present invention is wider than that of the conventional frequency synthesizer, which makes it possible to design a frequency synthesizer with wide locking range.

Therefore, a frequency synthesizer according to the present invention has superior characteristics such as wide locking range, low phase noise, and the prevention of performance degradation caused by an external environment or process variations.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A low voltage frequency synthesizer using a boosting method for a power supply voltage of a charge pump, comprising:
    a phase/frequency detector (PFD) that receives and compares a reference frequency and a feedback frequency to output a comparison signal;
    a charge pump that receives the comparison signal to output a current corresponding to the comparison signal;
    a low-pass filter (LPF) that generates a voltage corresponding to the output current of the charge pump;
    a voltage controlled oscillator (VCO) that receives the voltage of the LPF, amplifies the voltage to generate a boosting voltage, and outputs a frequency corresponding to the received voltage; and
    a DC converter that receives the boosting voltage of the VCO, converts the boosting voltage into a DC voltage, and applies the DC voltage as a power supply voltage of the charge pump.

2. The low voltage frequency synthesizer of claim 1, wherein the VCO includes an LC circuit which amplifies the received voltage to generate the boosting voltage.

3. The low voltage frequency synthesizer of claim 1, wherein the boosting voltage is two AC voltages which have opposite phases and of which the maximum magnitude reaches a value twice that of the input voltage.

4. The low voltage frequency synthesizer of claim 3, wherein the VCO further includes an auto amplitude controller (AAC) for constantly maintaining the amplitude of the AC voltages.

5. The low voltage frequency synthesizer of claim 3, wherein the charge pump receives the boosting voltage as a power supply voltage to operate in an extended output control voltage range.

6. The low voltage frequency synthesizer of claim 5, wherein a frequency tuning range of the VCO increases in accordance with the extended output control voltage range of the charge pump.

7. The low voltage frequency synthesizer of claim 5, wherein a frequency gain of the VCO decreases in accordance with the extended output control voltage range of the charge pump.

8. The low voltage frequency synthesizer of claim 1 further comprising a frequency divider that divides the output frequency of the VCO and generates the feedback frequency.

9. The low voltage frequency synthesizer of claim 2, wherein the VCO includes a switched cap bank array (SCB) as the LC circuit.

10. The low voltage frequency synthesizer of claim 4, wherein the VCO includes a pair of differential switching transistors which respectively receive the AC voltages as the boosting voltage and a current source transistor which receives a control voltage for amplitude control from the AAC.

11. The low voltage frequency synthesizer of claim 10, wherein one terminal of the current source transistor is commonly connected to one terminal of each of the differential switching transistors, the other terminal thereof is grounded, and a gate thereof receives the control voltage of the ACC.

12. The low voltage frequency synthesizer of claim 11, wherein the maximum value of the extended output control voltage range of the charge pump corresponds to a magnitude obtained by excluding voltages consumed by the DC converter and the charge pump from the maximum voltage of the boosting voltage.

* * * * *